United States Patent
Chatterjee et al.

(10) Patent No.: US 10,554,153 B2
(45) Date of Patent: Feb. 4, 2020

(54) MEMS DEVICE FOR HARVESTING SOUND ENERGY AND METHODS FOR FABRICATING SAME

(71) Applicant: Globalfoundries Singapore Pte. Ltd., Singapore (SG)

(72) Inventors: Aveek Nath Chatterjee, Singapore (SG); Rakesh Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 473 days.

(21) Appl. No.: 15/185,642

(22) Filed: Jun. 17, 2016

(65) Prior Publication Data

US 2017/0366107 A1 Dec. 21, 2017

(51) Int. Cl.
| | |
|---|---|
| *H01L 29/84* | (2006.01) |
| *H02N 2/18* | (2006.01) |
| *H03H 3/007* | (2006.01) |
| *H03H 9/02* | (2006.01) |
| *H03H 9/17* | (2006.01) |

(Continued)

(52) U.S. Cl.
CPC ............ *H02N 2/188* (2013.01); *H02N 2/22* (2013.01); *H03H 3/0077* (2013.01); *H03H 9/02338* (2013.01); *H03H 9/17* (2013.01); *H03H 2009/02165* (2013.01); *H03H 2009/155* (2013.01)

(58) Field of Classification Search
CPC ............ H02N 2/188; H02N 2/22; H03H 9/17; H03H 3/0077; H03H 9/02338; H03H 2009/02165; H03H 2009/155
See application file for complete search history.

(56) References Cited

U.S. PATENT DOCUMENTS 7,262,071 B2 * 8/2007 Larmer ................. B81B 3/0086
257/252
8,193,596 B2 6/2012 Lee et al.
(Continued)

FOREIGN PATENT DOCUMENTS

CN 201294088 Y 8/2009
CN 101665230 A 3/2010
(Continued)

OTHER PUBLICATIONS

Boisseau et al., Electrostatic Conversion for Vibration Energy Harvesting, Small-Scale Energy Harvesting, Intech, 2012, pp. 1-39.
(Continued)

*Primary Examiner* — Ismail A Muse
(74) *Attorney, Agent, or Firm* — Thompson Hine LLP

(57) ABSTRACT

Micro-Electro-Mechanical System (MEMS) devices for harvesting sound energy and methods for fabricating MEMS devices for harvesting sound energy are provided. In an embodiment, a method for fabricating a MEMS device for harvesting sound energy includes forming a pressure sensitive MEMS structure disposed over a semiconductor substrate and including a suspended structure in a cavity. Further, the method includes etching the semiconductor substrate to form an acoustic port through the semiconductor substrate configured to allow acoustic pressure to deflect the suspended structure.

9 Claims, 7 Drawing Sheets

(51) Int. Cl.
*H02N 2/00* (2006.01)
*H03H 9/15* (2006.01)

(56) References Cited

U.S. PATENT DOCUMENTS

| | | | |
|---|---|---|---|
| 2002/0059829 A1* | 5/2002 | Sakai | B60R 21/0132 |
| | | | 73/504.12 |
| 2002/0118850 A1 | 8/2002 | Yeh et al. | |
| 2004/0007942 A1 | 1/2004 | Nishida et al. | |
| 2005/0200242 A1 | 9/2005 | Degertekin | |
| 2006/0071578 A1* | 4/2006 | Drabe | G01C 19/5642 |
| | | | 310/309 |
| 2007/0169558 A1* | 7/2007 | Benzel | G01L 9/0054 |
| | | | 73/754 |
| 2010/0147076 A1* | 6/2010 | Diamond | B81C 1/00246 |
| | | | 73/514.32 |
| 2010/0206076 A1* | 8/2010 | Zoellin | G01P 15/0802 |
| | | | 73/514.32 |
| 2012/0319219 A1* | 12/2012 | Diamond | H04R 19/005 |
| | | | 257/416 |
| 2013/0127295 A1* | 5/2013 | Jun | H01L 41/1134 |
| | | | 310/327 |
| 2013/0160547 A1 | 6/2013 | Lee et al. | |
| 2014/0008224 A1* | 1/2014 | Agache | B03C 5/005 |
| | | | 204/451 |
| 2014/0105428 A1 | 4/2014 | Zoellin et al. | |
| 2014/0264656 A1 | 9/2014 | Ata et al. | |
| 2014/0267499 A1* | 9/2014 | Kato | B41J 2/14233 |
| | | | 347/50 |
| 2014/0270272 A1* | 9/2014 | Peng | H04R 31/006 |
| | | | 381/174 |
| 2014/0303688 A1 | 10/2014 | Kulah et al. | |
| 2015/0008542 A1* | 1/2015 | Kaelberer | H04R 19/04 |
| | | | 257/416 |
| 2015/0102437 A1* | 4/2015 | Liu | B81B 3/0021 |
| | | | 257/419 |
| 2016/0003924 A1* | 1/2016 | Sun | G01R 33/093 |
| | | | 324/322 |
| 2016/0178656 A1* | 6/2016 | Zhang | B81C 1/00261 |
| | | | 257/414 |
| 2016/0332867 A1* | 11/2016 | Tseng | B81B 7/02 |
| 2017/0115322 A1* | 4/2017 | Li | G01P 15/125 |
| 2017/0156002 A1* | 6/2017 | Han | H04R 1/14 |
| 2017/0230756 A1* | 8/2017 | Schelling | H04R 1/2803 |
| 2017/0265009 A1* | 9/2017 | Sridharan | H04R 3/00 |

FOREIGN PATENT DOCUMENTS

| | | |
|---|---|---|
| CN | 104836473 A | 8/2015 |
| KR | 20140064005 A | 5/2014 |
| TW | 201240476 A | 10/2012 |
| TW | 201352014 A1 | 12/2013 |
| TW | 201448608 A | 12/2014 |
| WO | 2010002887 A2 | 1/2010 |
| WO | 2010002887 A3 | 4/2010 |
| WO | 2013081560 A1 | 6/2013 |

OTHER PUBLICATIONS

Jeon et al., Novel Energy Harvesting Using Acoustically Oscillating Microbubbles, Transducers 2015, Jun. 1-25, 2015, pp. 1933-1936.
Kumar et al., Piezoelectric Energy Harvester Design and Power Conditioning, IEEE Students' Conference on Electrical, Electronics and Computer Science, 2014, pp. 1-6.
Sodano et al., Estimation of Electric Charge Output for Piezoelectric Energy Harvesting, LA-UR-04-2449, Strain Journal 40(2), 2004, pp. 1-28.
Tang et al., A Self-Powered Wireless Sensing Node for Event-Driven Alerting Based on a Bi-Stable Vibration Energy Harvester, Transducers 2015, Jun. 21-25, 2015, pp. 1215-1218.
Tang et al, A Smart Energy-Harvester With the Action of Electric-Power Generating Triggered by Pre-Set Vibration Threshold, Transducers 2015, Jun. 21-25, 2015, pp. 1941-1944.
Taiwan Intellectual Property Office, Examination Report for Taiwanese Patent Application No. 105122589 dated Jun. 6, 2017.
National Intellectual Property Administration, Office Action issued in Chinese Patent Application No. 201710457190.3 dated Jul. 15, 2019 and English translation thereof.

* cited by examiner

MEMS DEVICE FOR HARVESTING SOUND ENERGY AND METHODS FOR FABRICATING SAME

TECHNICAL FIELD

The technical field generally relates to Micro-Electro-Mechanical-Systems (MEMS), and more particularly relates to the use of MEMS devices for harvesting sound energy and to methods for fabricating such MEMS devices.

BACKGROUND

Research and development in microelectronics have continued to produce astounding progress in MEMS technology. MEMS technologies are becoming ever more prevalent in society every day. Use of MEMS technology has limitless applications through modular measurement devices such as accelerometers, gyroscopes, actuators, microphones, and sensors including pressure sensors and inertial sensors.

Likewise, applications for miniature sensors are wide ranging and include embedded sensors. One area of interest involves providing required electrical power to embedded sensors. Conventional power supplies, such as batteries, can be disposed external to sensors. Batteries are not generally a viable solution for devices such as embedded sensors. Batteries contain a finite amount of energy and have a limited lifetime. Batteries also can contain hazardous chemicals, can be quite bulky and can fail without notice.

For those applications in which sensors are completely embedded in a structure with no physical connection to a location outside the structure or in which sensors are embedded in moving locations, supplying power is generally difficult. As a result, these sensors typically need their own self-powered power supply.

Further, some applications utilize a large network of sensors, such those with thousands of sensors. It is impracticable to manage and replace batteries for such a large number of sensors. Therefore, a self-powered power supply would allow for expanded use of large networks of sensors by alleviating battery maintenance concerns.

Accordingly, it is desirable to provide MEMS devices for harvesting sound energy and methods for fabricating such MEMS devices. Further, it is desirable to provide a monolithic MEMS device including a suspended structure and proof mass that are adjusted to have a resonant frequency that matches the frequency of sound at a selected location of use. Furthermore, other desirable features and characteristics will become apparent from the subsequent detailed description and the appended claims, taken in conjunction with the accompanying drawings and this background.

BRIEF SUMMARY

MEMS devices for harvesting sound energy and methods for fabricating MEMS devices for harvesting sound energy are provided. In an embodiment, a method for fabricating a MEMS device for harvesting sound energy includes forming a pressure sensitive MEMS structure disposed over a semiconductor substrate and including a suspended structure in a cavity. Further, the method includes etching the semiconductor substrate to form an acoustic port through the semiconductor substrate configured to allow acoustic pressure to deflect the suspended structure.

In another exemplary embodiment, a method for fabricating an integrated circuit for harvesting sound energy is provided. The method includes identifying a selected frequency of sound. Further, the method includes forming a pressure sensitive MEMS structure disposed over a semiconductor substrate and including a suspended structure. As formed, the suspended structure has a resonant frequency. The method further includes forming a proof mass on the suspended structure to adjust the resonant frequency of the pressure sensitive MEMS structure to a desired resonant frequency matching the selected frequency. Also, the method includes etching the semiconductor substrate to form an acoustic port through the semiconductor substrate configured to allow acoustic pressure to deflect the suspended structure.

In yet another exemplary embodiment, a sound energy harvesting MEMS device is provided. The sound energy harvesting MEMS device includes a semiconductor substrate and a pressure sensitive MEMS structure disposed over the semiconductor substrate and including a suspended structure in a cavity. The sound energy harvesting MEMS device further includes an acoustic port through the semiconductor substrate establishing an open, structure-free conduit suitable to allow acoustic pressure to deflect the suspended structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
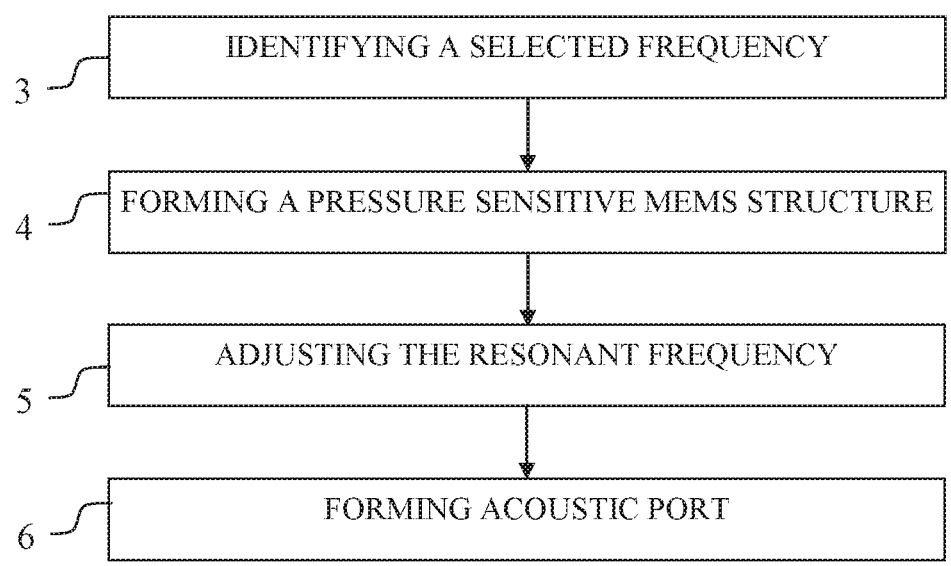
FIG. 1 is a flow chart illustrating a method for fabricating an integrated circuit with a sound energy harvesting MEMS device according to an embodiment herein.

The following detailed description is merely exemplary in nature and is not intended to limit the MEMS devices for harvesting sound energy and methods for fabricating MEMS devices for harvesting sound energy. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and process steps described herein may be incorporated into a more comprehensive procedure or process having additional steps or functionality not described in detail herein. In particular, various steps in the fabrication of MEMS devices are well-known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, an exemplary MEMS device is provided with a suspended structure and proof mass that are formed with a resonant frequency. As used conventionally, a proof mass or test mass is a known quantity of mass used in a measuring instrument as a reference for the measurement of an unknown quantity. The suspended structure and proof mass are adjustable to provide a selected resonant frequency, such as a resonant frequency that matches the frequency of sound at a selected deployment location of the MEMS device. Further, in an exemplary method, the MEMS device encloses the suspended structure in a cavity over a semiconductor substrate before etching the semiconductor substrate to form an acoustic port through the semiconductor substrate. The port is configured to allow acoustic pressure to deflect the suspended structure as a result of pressure differential between the atmosphere and the cavity. For example, the port forms a pathway of a fluid medium, such as air, through which sound waves can move to deflect the suspended structure. As used herein, a suspended structure may be a cantilever, a diaphragm, or the like. In a suspended structure, a portion of the structure is located within a cavity or between cavities such that the portion may move within the cavity or cavities. The movable portion of a diaphragm-type suspended structure may be fully structurally connected to non-movable portions of the structure around its periphery such that the lower cavity below the suspended structure is completely separated from the upper cavity above the suspended structure. Alternatively, the movable portion of a cantilever-type suspended structure includes a free end, or ends, that is not structurally connected to non-movable portions of the structure in at least one direction such that the lower cavity and upper cavity are in fluid communication.

FIG. 1 provides a flow chart for a method for fabricating an integrated circuit for harvesting sound energy. As shown, the method 2 includes identifying a selected frequency of sound at action block 3. For example, for deployment of a sensor and MEMS device at a selected location, analysis may be performed to identify the frequency of sound most typically encountered at that location. An exemplary location includes a vehicle such as an airplane, a helicopter, an automobile, a ship; tunnel; an airport; shipyard; a factory; or any other location where substantial sound is generated.

As shown, the method 2 further includes forming a pressure sensitive MEMS structure disposed over a semiconductor substrate at action block 4. The pressure sensitive MEMS structure includes a suspended structure, such as a diaphragm, cantilever or the like. The suspended structure has a resonant frequency as constructed. The resonant frequency of a suspended structure can be determined using conventional testing processes. For example, the resonant frequency of a suspended structure is proportional to the square root of the stiffness of the suspended structure divided by the mass of the suspended structure.

The method 2 further includes adjusting the resonant frequency of the suspended structure to a desired resonant frequency matching the selected frequency by forming a proof mass on the suspended structure at action block 5. The resonant frequency of the suspended structure, including the proof mass, is proportional to the square root of the stiffness of the suspended structure divided by the mass of the suspended structure, including the mass of the proof mass. Thus, the resonant frequency can be adjusted by forming a desired proof mass through appropriate lithography and etching. The piezoelectric material and the thickness of the piezoelectric material also affect the resonant frequency through contributing to the mass and stiffness of the overall suspended structure.

At action block 6, the method 2 includes forming an acoustic port through the semiconductor substrate. The acoustic port is configured to allow acoustic pressure to deflect the suspended structure. In other words, sound waves may propagate through a fluid in the acoustic port, such as air, and into contact with the suspended structure. As a sound wave is formed of compression regions of high air pressure and rarefaction regions of low air pressure, when these regions of acoustic pressure reach the pressure sensitive MEMS structure, they cause deflection of the suspended structure.

Figure 2:
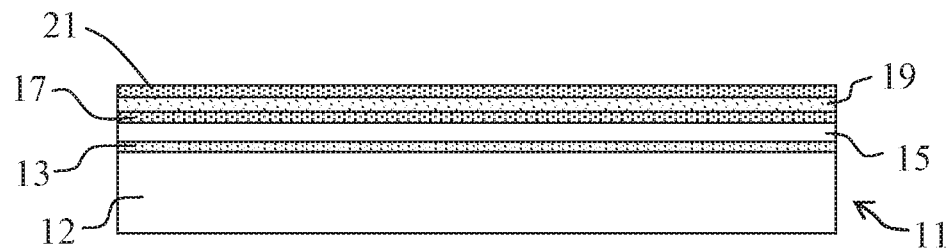
FIGS. 2-15 illustrate cross sectional views of processing of an integrated circuit for forming a sound energy harvesting MEMS device according to an embodiment herein FIG. 16 provides a bottom view of an embodiment of a suspended structure and proof mass for a sound energy harvesting MEMS device.

FIGS. 2-15 illustrate a portion of an integrated circuit during formation of a pressure sensitive MEMS structure as described above. In FIG. 2, the partially fabricated integrated circuit 10 includes a substrate 11, such as a semiconductor substrate. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 10 weight percent based on the total weight of the material unless otherwise indicated.

In FIG. 2, the exemplary substrate 11 is a SOI substrate including a carrier layer 12, an insulator layer 13, and a semiconductor layer 15. In an exemplary embodiment, the carrier layer 12 has a thickness of from about 500 to about 1000 μm, such as about 725 μm. In an exemplary embodiment, the insulator layer 13 has a thickness of from about 0.5 to about 3 μm, such as about 1 μm. In an exemplary embodiment, the semiconductor layer 15 has a thickness of from about 10 to about 40 μm, such as from about 15 to about 20 μm.

As shown, a bottom electrode layer 17 is formed over the semiconductor layer 15. An exemplary bottom electrode layer 17 is molybdenum. The bottom electrode layer 17 may be any other conductive material such as metal suitable for use in a MEMS device. In an exemplary embodiment, the bottom electrode layer 17 is formed directly on the semiconductor layer 15.

In FIG. 2, a MEMS device layer 19 is formed over the bottom electrode layer 17. An exemplary MEMS device layer 19 is aluminum nitride (AlN). The MEMS device layer 19 may be any other material suitable for use in a MEMS device, such as lead zirconate titanate (PZT) or another suitable piezoelectric material. In an exemplary embodiment, the MEMS device layer 19 is formed directly on the bottom electrode layer 17.

A top electrode layer 21 is formed over the MEMS device layer 19. An exemplary top electrode layer 21 may be formed from the same material as the bottom electrode layer 17. For example, the top electrode layer 21 may be molybdenum. The top electrode layer 21 may be any other conductive material (e.g., aluminum, copper, or alloys thereof) such as metal suitable for use in a MEMS device. In an exemplary embodiment, the top electrode layer 21 is formed directly on the MEMS device layer 19.

Figure 3:
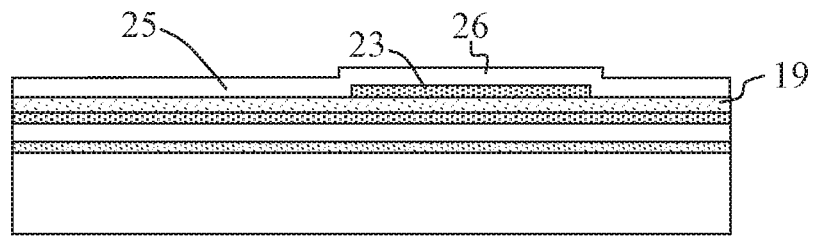

In FIG. 3, the top electrode layer 21 is etched to form a top electrode 23. Although not shown, in an exemplary embodiment, a mask (not shown) such as a photoresist mask is deposited and patterned over the top electrode layer 21 before the top electrode layer 21 is etched to form the top electrode 23. Then, a dielectric layer 25 is deposited over the top electrode 23 and MEMS device layer 19, as shown in FIG. 3. An exemplary dielectric layer 25 is silicon oxide. As shown, the dielectric layer 25 includes a raised portion 26 lying directly over the top electrode 23.

Figure 4:
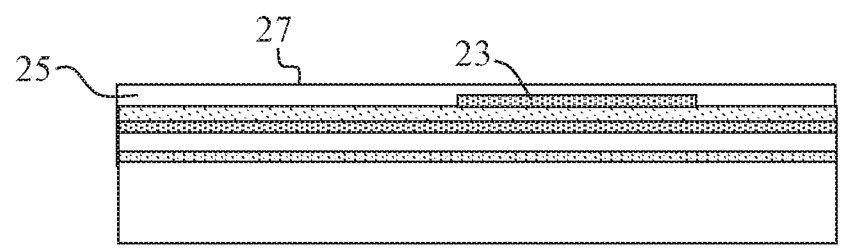

In FIG. 4 and with continued reference to FIG. 3, the partially fabricated integrated circuit including 10 is planarized, such as by chemical mechanical planarization (CMP). The planarization process eliminates the raised portion 26 of the dielectric layer 25 and forms the dielectric layer 25 with a planar upper surface 27.

Figure 5:
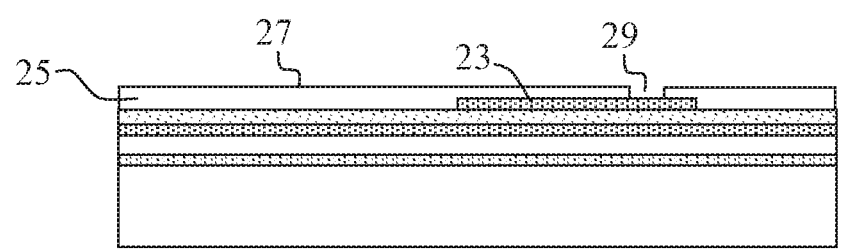

The method may continue in FIG. 5 by etching a contact window 29 into the dielectric layer 25 overlying the top electrode 23. For example, a mask such as a photoresist mask may be deposited and patterned over the dielectric layer 25 before the dielectric layer 25 is selectively etched to form the contact window 29 landing on the top electrode 23. The mask may then be removed.

Figure 6:
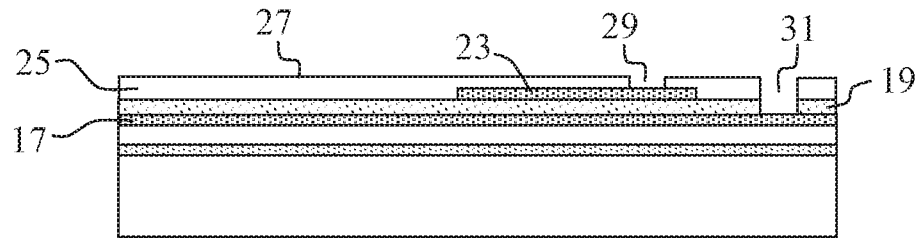

In FIG. 6, another etch process is used on another region of the partially fabricated integrated circuit 10. For example, another mask such as a photoresist mask may be deposited and patterned over the dielectric layer 25 outside of top electrode 23. Then an etch process is performed to etch through the dielectric layer 25 and MEMS device layer 19 to form a contact window 31 landing on the bottom electrode layer 17. The mask may then be removed.

Figure 7:
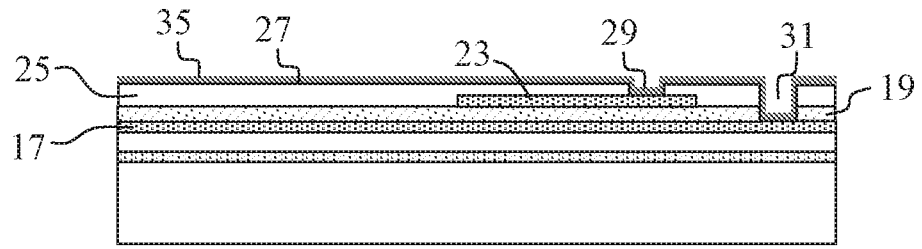
Figure 8:
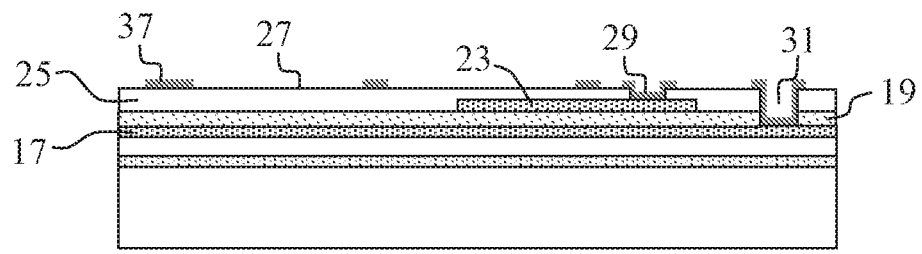

A contact material 35 is then blanket deposited over the partially fabricated integrated circuit 10 in FIG. 7. An exemplary contact material is a metal such as aluminum, copper or tungsten. In FIG. 8, the contact material 35 is patterned to form a patterned layer 37 of contact material. Portions of the patterned layer 37 of contact material may form contacts to the top electrode 23 and bottom electrode layer 17 or to form MEMS device structures.

Figure 9:
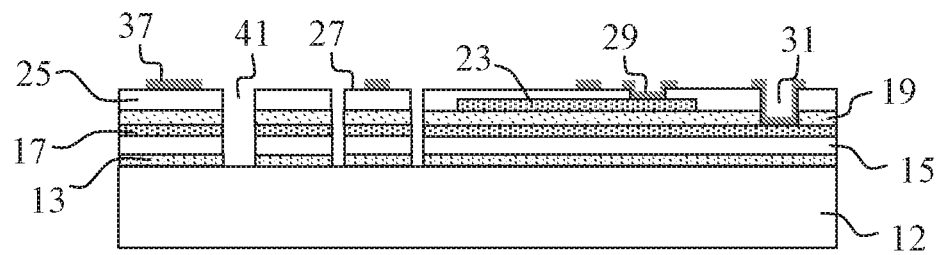

In FIG. 9, trenches 41 are etched through the dielectric layer 25, MEMS device layer 19, bottom electrode layer 17, semiconductor layer 15 and insulator layer 13 outside of top electrode 23 to land on carrier layer 12. The trenches 41 are formed to define and isolate various MEMS device structures formed from the etched layers, such as flexible structures of different energy harvester designs (diaphragms, cantilevers, etc.).

Figure 10:
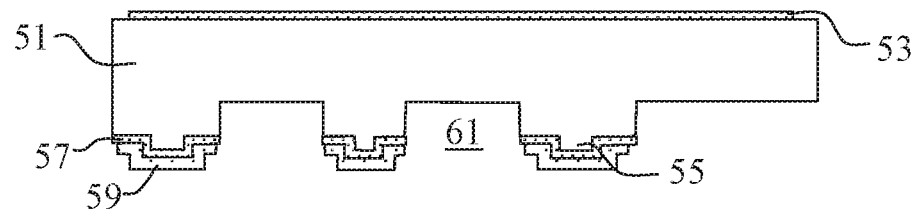

Referring to FIG. 10, a second substrate 51, such as a semiconductor substrate, is processed. It is to be appreciated that various fabrication techniques may be conducted in accordance with the methods described herein to form the semiconductor substrate 51 as shown. An exemplary substrate is formed by high resistivity silicon, such as silicon having resistivity greater than 40 Ω-cm. An exemplary semiconductor substrate 51 is a bulk silicon wafer. An exemplary semiconductor substrate has a thickness of from about 250 to about 1000 microns, such as from about 400 to about 600 microns. An insulator layer 53 may be formed on the substrate 51. An exemplary insulator layer 53 is silicon oxide.

FIG. 10 is illustrated with the second substrate 51 in an orientation in which bonding to the substrate 11 may be performed. During processing, the second substrate 51 may be inverted to facilitate formation of structures and layers 55, 57 and 59. For example, various masking and etching techniques may be performed to form extension portions 55 of the second substrate 51. Then a dielectric layer 57 may be deposited over the second substrate 51. An exemplary dielectric layer 57 is silicon oxide. Further, a bonding layer 59 may be deposited over the dielectric layer 57. An exemplary bonding layer 59 is germanium. Then, the bonding layer 59, dielectric layer 57 and substrate 51 may be etched to form trenches 61.

Figure 11:
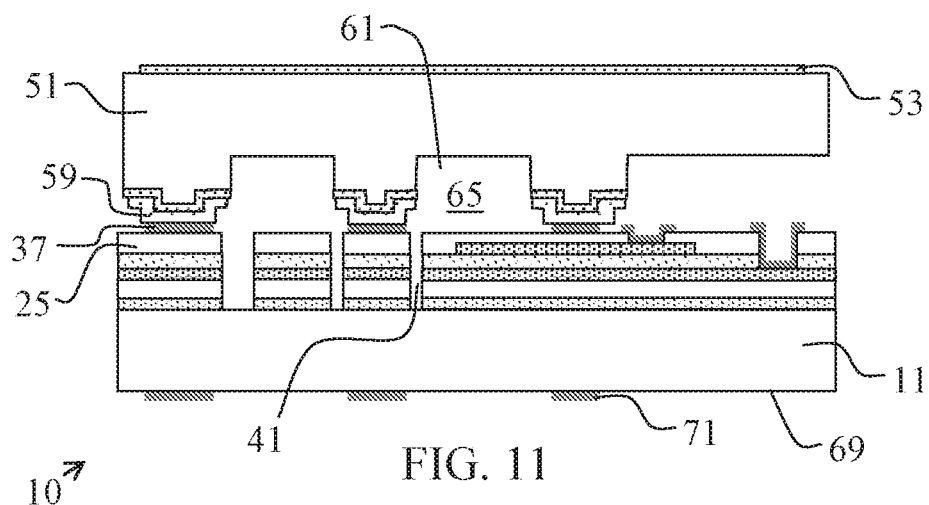

In FIG. 11, the second substrate 51 is bonded to the first substrate 11. For example, the second substrate 51 may be bonded to the first substrate 11 via eutectic bonding. In FIG. 11, the bonding layer 59 of the second substrate 51 is bonded to the patterned layer 37 of contact material over the substrate 11. As a result, cavities 65 are defined and completely bounded by the structures of the first substrate 11 and the second substrate 51. For example, a cavity 65 is formed from trench 41 and trench 61. Also, a layer may be deposited on the back side 69 of the substrate 11 and etched to form contact pads 71. Exemplary contact pads 71 are formed from a metal such as aluminum, copper or tungsten.

Figure 12:
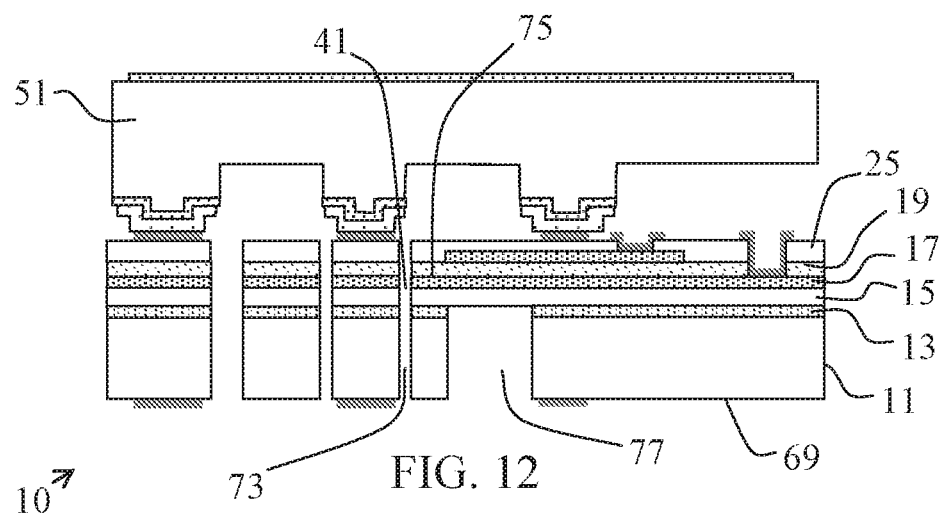

The method may continue in FIG. 12 with a back side etch process. Specifically, the back side 69 of the first substrate 11 is etched such as by a deep reactive-ion etch (DRIE) process. As a result, trenches 73 are formed through the first substrate 11 and in communication with trenches 41 passing through layers 25, 19, 17, 15 and 13. This etch process releases MEMS device structures 75 from one another. Also, the etch process may form a cavity 77 through the substrate 11 and insulator layer 13.

Figure 13:
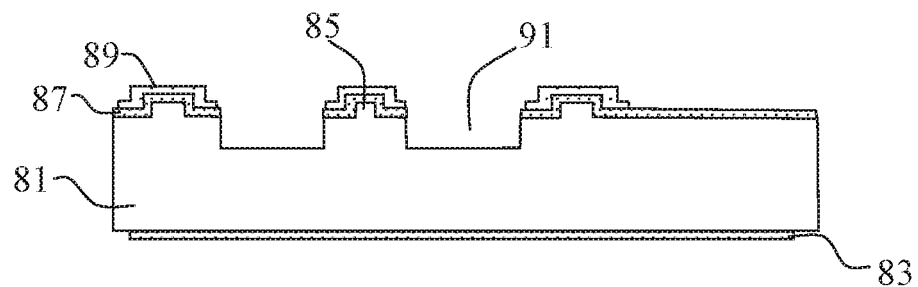

In FIG. 13, a third substrate 81, such as a semiconductor substrate, is processed. It is to be appreciated that various fabrication techniques may be conducted in accordance with the methods described herein to form the semiconductor substrate 81 as shown. An exemplary substrate is formed by high resistivity silicon, such as silicon having resistivity greater than 40 Ω-cm. An exemplary semiconductor substrate 81 is a bulk silicon wafer. An exemplary semiconductor substrate has a thickness of from about 250 to about 1000 microns, such as from about 400 to about 600 microns. An insulator layer 83 may be formed on the substrate 81. An exemplary insulator layer 83 is silicon oxide.

The third substrate 81 is etched to form extension portions 85. Then, a dielectric layer 87 may be deposited over the third substrate 81. An exemplary dielectric layer 87 is silicon oxide. Further, a bonding layer 89 may be deposited over the dielectric layer 87. An exemplary bonding layer 89 is germanium. Then, the bonding layer 89, dielectric layer 87 and substrate 81 may be etched to form trenches 91.

Figure 14:
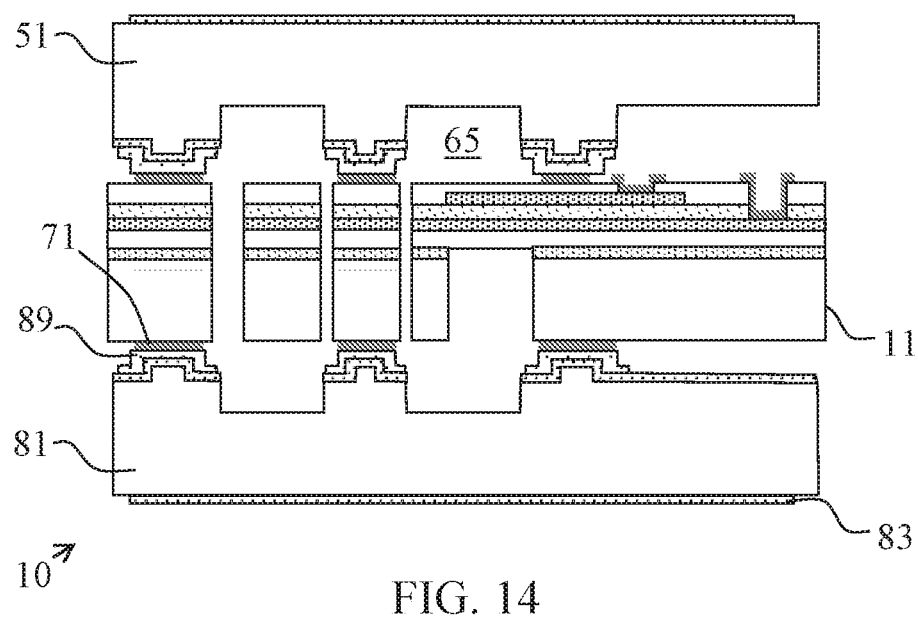

The method may continue in FIG. 14 with bonding the third substrate 81 to the first substrate 11. For example, the third substrate 81 may be bonded to the first substrate 11 via eutectic bonding. In FIG. 14, the bonding layer 89 of the third substrate 81 is bonded to the contact pads 71 on substrate 11. As a result, the cavities 65 are hermetically sealed and completely bounded by the structures of the first substrate 11 and the second substrate 51.

Figure 15:
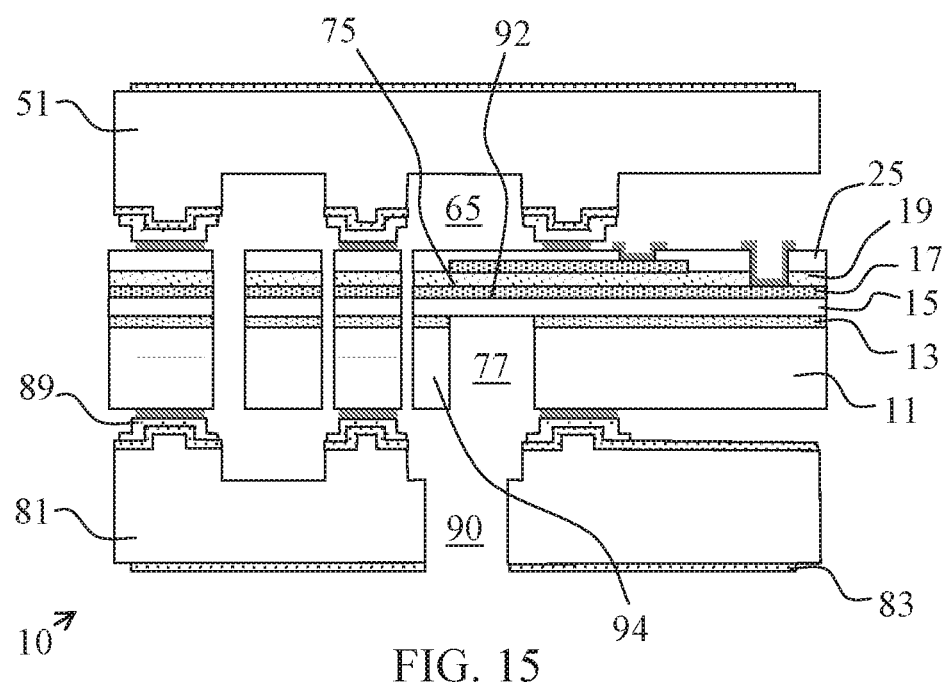

In FIG. 15, a back side etch of third substrate 81 is performed. An exemplary back side etch is performed by a DRIE process. The etch process forms an acoustic port 90 through the insulator layer 83 and third substrate 81. As shown, the acoustic port 90 is in fluid communication with the cavity 65 and the cavity 77. As a result, a sound wave propagating through acoustic port 90 may deflect the MEMS device structure 75 formed between cavity 65 and cavity 77, i.e., MEMS acoustic energy harvester 75.

It is noted that the portion of the semiconductor layer 15, bottom electrode layer 17, MEMS device layer 19 and top electrode 23, and dielectric layer 25 located between cavity 65 and cavity 77 in FIG. 15 form a suspended structure 92 of the MEMS device structure 75. Further, the portion of the substrate 11 connected to the suspended structure 92 of MEMS device structure 75 forms a proof mass 94 for the MEMS device structure 75. The dimensions of the cavity 77 may be adjusted during the etching process shown in FIG. 12 to adjust the resonant frequency of the MEMS acoustic energy harvester 75 formed between cavity 65 and cavity 77.

Figure 16:
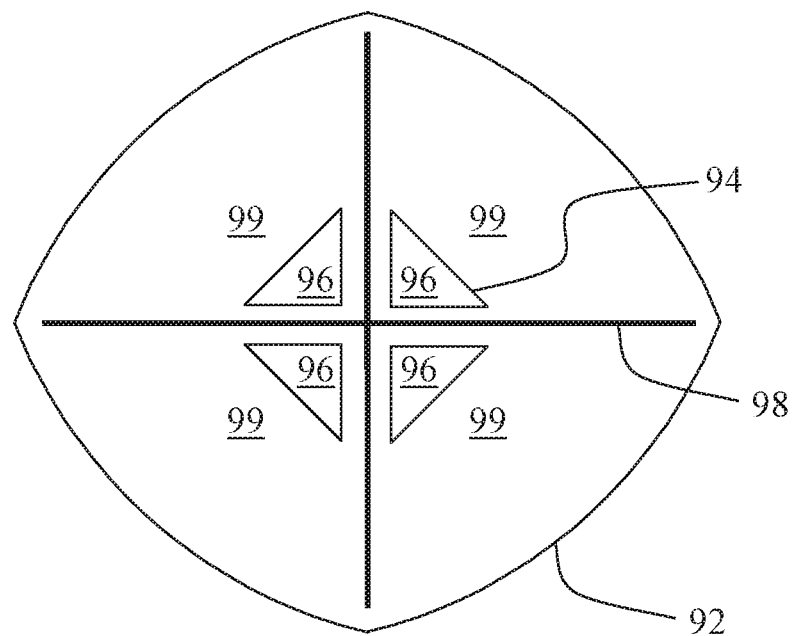

While the MEMS acoustic energy harvester 75 of FIG. 15 is shown with a cantilever-type suspended structure 92, an exemplary embodiment provides a split-diaphragm-type suspended structure 92. A bottom view of such a structure is illustrated in FIG. 16. As shown, the proof mass 94 may be formed with four disconnected portions 96. Further, the suspended structure 92 is formed with two intersecting gaps or openings 98 that define independently movable suspended portions 99. A disconnected portion 96 of the proof mass 94 is located on each suspended portion 99 of the structure 92. As shown, the suspended portions 99 may be connected near a circumferential edge of the structure 92. The shape of the proof mass 94 and suspended structure 92 may include other variations to optimize energy harvesting from deflection due to acoustic pressure.

Figure 17:
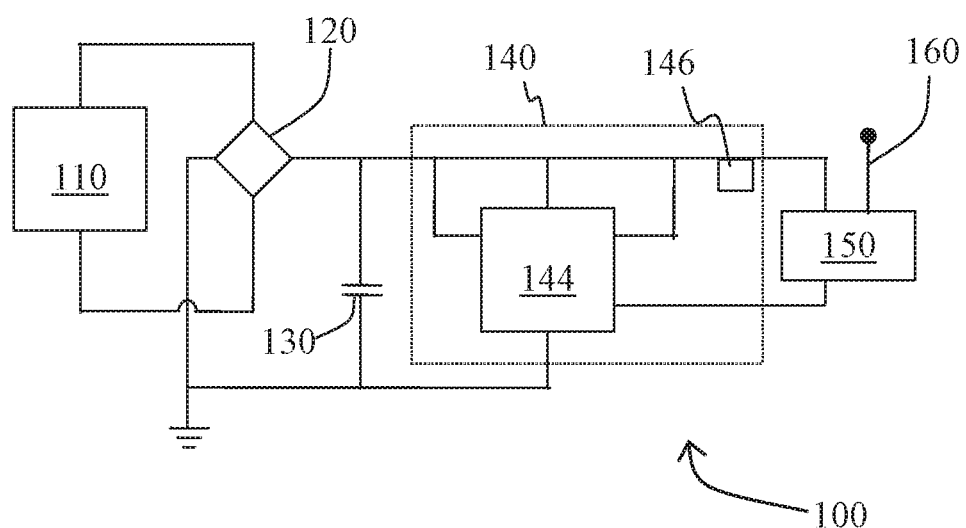
FIG. 17 provides a circuit diagram showing use of a sound harvesting MEMS device for powering a sensor or an RF front end module according to an embodiment herein.

Deflection of any disconnected portion 96 of the proof mass 94 leads to charge generation due to the piezoelectric effect. The charge can be used to generate power. As a result, power is harvested from acoustic pressure. The top electrode pattern can be optimized to increase the open circuit voltage of the energy harvester FIG. 17 illustrates a circuit 100 in which an energy-harvesting MEMS device may be used. As shown, the MEMS device 110 is electrically connected through a rectifying bridge 120 to a storage capacitor 130, and charging controller 140. The charging controller 140 includes a voltage detector 144 and switch 146 and is further electrically connect to a RF front end module or sensor 150 and antenna 160 as shown. Each element of the circuit 100 of may be fabricated in the method of fabricating integrated circuit 10 as is well understood.

As described herein, self-powered systems can convert energy from an existing source of sound energy into a different form of energy, such as electrical energy, using the described MEMS device. The devices described herein may generate 1 microwatt of power from 130 decibels over a ten square centimeter suspended structure in a continuous mode.

As described herein, devices are provided with a suspended structure formed in a cavity and including an acoustic port to propagate sound energy to the suspended structure. Further, such devices are formed from a single monolithic substrate. Also, an exemplary MEMS device is provided with a proof mass that is adjustable in size to provide the suspended structure with a resonant frequency that match the sound frequency at a deployment location.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method of fabricating a Micro-Electro-Mechanical System (MEMS) device for harvesting sound energy, the method comprising:
    forming a pressure-sensitive MEMS structure, wherein forming the pressure-sensitive MEMS structure comprises:
    forming the pressure-sensitive MEMS structure on a first semiconductor substrate;
    enclosing an upper portion of a cavity between the first semiconductor substrate and a second semiconductor substrate; and
    after enclosing the upper portion of the cavity, etching the first semiconductor substrate to form a lower portion of the cavity, wherein a suspended structure is formed between the upper portion of the cavity and the lower portion of the cavity;
    after etching the first semiconductor substrate to form the lower portion of the cavity and forming the suspended structure between the upper portion of the cavity and the lower portion of the cavity, enclosing the lower portion of the cavity with a third semiconductor substrate; and
    etching the third semiconductor substrate to form an acoustic port through the third semiconductor substrate configured to allow acoustic pressure to deflect the suspended structure.

2. The method of claim 1 further comprising:
    bonding a lower side of the first semiconductor substrate to the third semiconductor substrate; and
    wherein etching the third semiconductor substrate to form the acoustic port comprises:
    etching the first semiconductor substrate and the third semiconductor substrate to form the acoustic port through the first semiconductor substrate and through the third semiconductor substrate.

3. The method of claim 1 wherein forming the pressure-sensitive MEMS structure comprises:
   forming piezoelectric elements.

4. The method of claim 1 wherein forming the pressure-sensitive MEMS structure comprises:
   forming an aluminum nitride (AlN) or a lead zirconate titanate (PZT) layer.

5. The method of claim 1 further comprising:
   identifying a selected frequency of sound at a selected deployment location; and
   wherein forming the pressure-sensitive MEMS structure comprises:
   forming the suspended structure with a resonant frequency matching the selected frequency of sound.

6. The method of claim 1 wherein forming the pressure-sensitive MEMS structure comprises:
   forming a proof mass on the suspended structure.

7. The method of claim 6 wherein the proof mass includes a plurality of disconnected portions arranged on the suspended structure.

8. The method of claim 7 wherein the disconnected portions of the proof mass are arranged on the suspended structure to adjust a resonant frequency of the suspended structure.

9. The method of claim 7 wherein the suspended structure includes a plurality of openings that define a plurality of independently movable suspended portions, and one of the disconnected portions of the proof mass is located on each of the independently movable suspended portions of the suspended structure.

* * * * *